United States Patent
Zepeda et al.

(10) Patent No.: US 8,314,725 B2
(45) Date of Patent: Nov. 20, 2012

(54) ON-DIE DIGITAL-TO-ANALOG CONVERSION TESTING

(75) Inventors: Paola Zepeda, Chandler, AZ (US); David E. Duarte, Portland, OR (US); Gregory F. Taylor, Portland, OR (US); Atul Maheshwari, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 139 days.

(21) Appl. No.: 12/883,125

(22) Filed: Sep. 15, 2010

(65) Prior Publication Data

US 2012/0062401 A1 Mar. 15, 2012

(51) Int. Cl.
*H03M 1/10* (2006.01)

(52) U.S. Cl. ........ 341/120; 341/118; 341/119; 341/121; 341/155

(58) Field of Classification Search .......... 341/118–121, 341/155
See application file for complete search history.

(56) References Cited

U.S. PATENT DOCUMENTS

| | | | | |
|---|---|---|---|---|
| 4,335,373 A | * | 6/1982 | Sloane | 341/120 |
| 4,419,656 A | * | 12/1983 | Sloane | 341/120 |
| 4,839,651 A | * | 6/1989 | Banno | 341/120 |
| 5,175,547 A | * | 12/1992 | Lyon et al. | 341/120 |
| 5,631,649 A | * | 5/1997 | Nakamura | 341/144 |
| 5,659,312 A | * | 8/1997 | Sunter et al. | 341/120 |
| 6,339,388 B1 | * | 1/2002 | Matsumoto | 341/120 |
| 6,348,785 B2 | * | 2/2002 | Wohlfarth | 324/73.1 |
| 6,429,732 B1 | | 8/2002 | Tedrow et al. | |
| 6,445,325 B1 | * | 9/2002 | Burns | 341/144 |
| 6,549,150 B1 | * | 4/2003 | Bulaga et al. | 341/120 |
| 7,612,698 B2 | * | 11/2009 | Kimura | 341/120 |
| 7,791,519 B2 | * | 9/2010 | Matsukawa et al. | 341/144 |
| 8,049,650 B2 | * | 11/2011 | Lin et al. | 341/120 |
| 2003/0063019 A1 | * | 4/2003 | Bulaga et al. | 341/120 |
| 2004/0032300 A1 | | 2/2004 | Joordens et al. | |
| 2009/0251103 A1 | | 10/2009 | Yamamoto et al. | |
| 2011/0279149 A1 | | 11/2011 | Maheshwari | |

OTHER PUBLICATIONS

Maxim Integrated Products, "INL/DNL Measurements for High-Speed Analog-to-Digital Converters (ADCs)", Application Note 283, [online] Nov. 20, 2001, [retrieved on Jul. 22, 2010], retrieved from the Internet at <URL: maxim-ic.com/app-notes/ . . ./283> 7 pp.
Jarman, D., "A Brief Introduction to Sigma Delta Conversion", Application Note 9504, May 1995, 7 pp.
Maxim Integrated Products, "Demystifying Sigma-Delta ADCs", Application Note 1870, Jan 31, 2003, 14 pp.
Notice of Allowance 1 for U.S. Appl. No. 12/778,874, dated May 21, 2012, 9 pp. [P34455 (NOA1)].
Office Action 1 for U.S. Appl. No. 12/778,874, dated Dec. 12, 2011, 9 pp. [P34455 (OA1)].
Response to Office Action 1 for U.S. Appl. No. 12/778,874, dated Apr. 12, 2012, 14 pp. [P34455 (ROA1)].
Response to Restriction Requirement for U.S. Appl. No. 12/778,874, dated Dec. 1, 2011, 8 pp. [P34455 (R-RestReq)].
Restriction Requirement for U.S. Appl. No. 12/778,874, dated Nov. 2, 2011, 6 pp. [P34455 (RestReq)].

* cited by examiner

*Primary Examiner* — Linh Nguyen
(74) *Attorney, Agent, or Firm* — Konrad Raynes Davda & Victor LLP (57) ABSTRACT

In one embodiment, an analog-to-digital conversion in an integrated circuit is evaluated by an on-die testing circuit. For example, the on-die test circuit 370 can characterize one or both of the linearity and monotonicity of the digital-to-analog conversion. The value of a conversion output for a digital input code may be compared to the value of a prior conversion output of a prior step to provide digital difference values for each step of a sweep of digital input codes. Digital difference values may be compared to one or more predetermined limits to provide one or more pass/fail tests on-board the die. Other embodiments are described and claimed.

17 Claims, 6 Drawing Sheets

FIG. 10

ON-DIE DIGITAL-TO-ANALOG CONVERSION TESTING

BACKGROUND

Integrated circuits frequently contain digital-to-analog converters which convert a digital input value to an analog output signal. In many applications, it is preferred that the conversion be linear, that is, that the analog output change proportionately to a change in the digital input. However, various factors can introduce nonlinearities in the conversion operation. For example, variations in the fabrication processes from one integrated circuit die or wafer to the next can cause variations in the performance of the analog circuits disposed on those dies or wafers. As the scaling of integrated circuits continues to shrink, it is believed that such variations in performance may increase.

Figure 1:
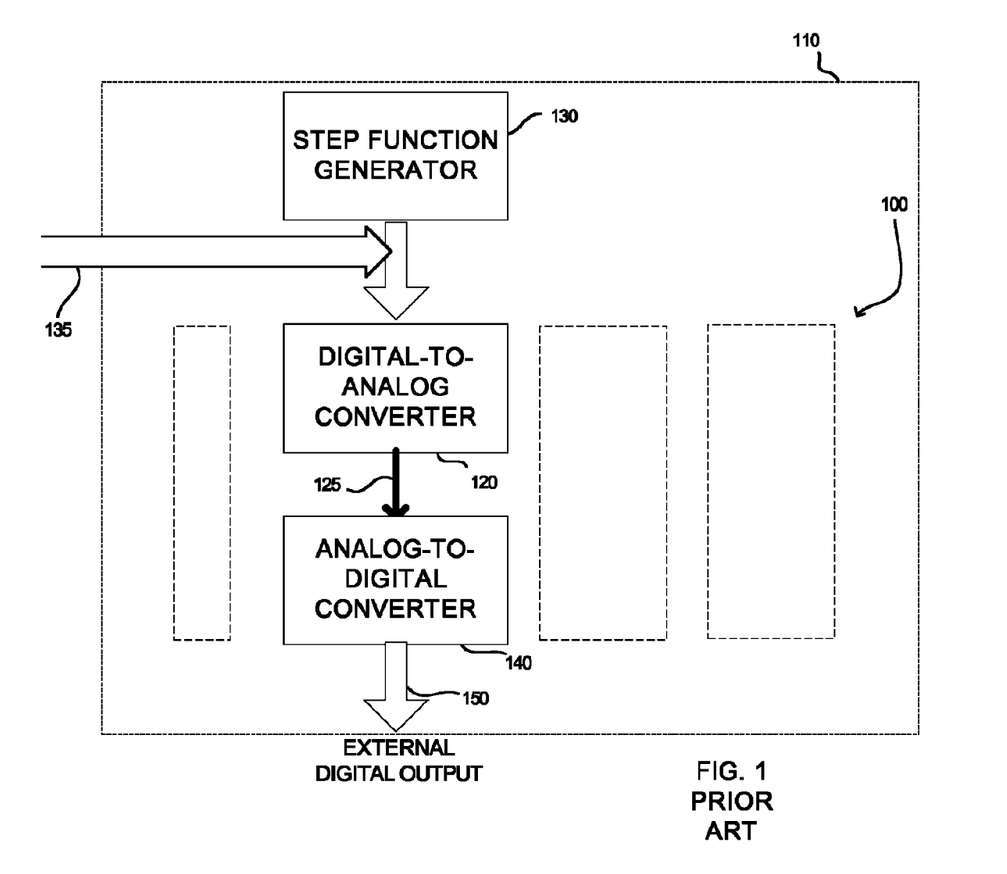
FIG. 1 illustrates a prior art circuit for testing a digital-to-analog converter in an integrated circuit on a die.

Various tests have been devised to detect performance variations during the manufacture of integrated circuit devices. For example, FIG. 1 shows an integrated circuit 100 on a die 110. The integrated circuit includes a digital-to-analog converter 120 having an analog output 125. To test the digital-to-analog converter 120, the integrated circuit 100 may further include a step function generator 130 which generates a sequence of digital input codes. Alternatively, a sequence of digital input codes may be scanned into the die 110 through an external input port 135.

The value of each digital input code is typically incremented (or decremented) a fixed amount each step by the function generator 130. If the digital-to-analog conversion is linear, the value of the analog output of the digital-to-analog converter 120 will rise (or fall) a fixed amount as the digital input code is incremented (or decremented) a fixed amount each step.

To test the linearity of the conversion by the digital-to-analog converter 120, the integrated circuit 100 may further include an analog-to-digital converter 140 which is on board the same die 110 as the digital-to-analog converter 120. The analog-to-digital converter 140 converts the analog output of the digital-to-analog converter 120 to a digital output code, which is typically at a higher resolution that the input to the digital-to-analog converter 120, and is output at an external output port 150 of the die 110. The digital output codes produced by the analog-to-digital converter 140 in response to each step of the step function generator 130, can be collected by various devices external to the die 110 such as a general purpose computer or dedicated testing apparatus coupled to the external output port 150 of the die 110. Frequently, a digital output code is scanned out of the die at each step of the function generator 130. Such a process can be time consuming. The digital data collected is typically processed by external apparatus to determine the linearity and other characteristics of the conversion process. In other prior devices, an analog-to-digital converter 140 may also be external to the die 110.

Figure 2:
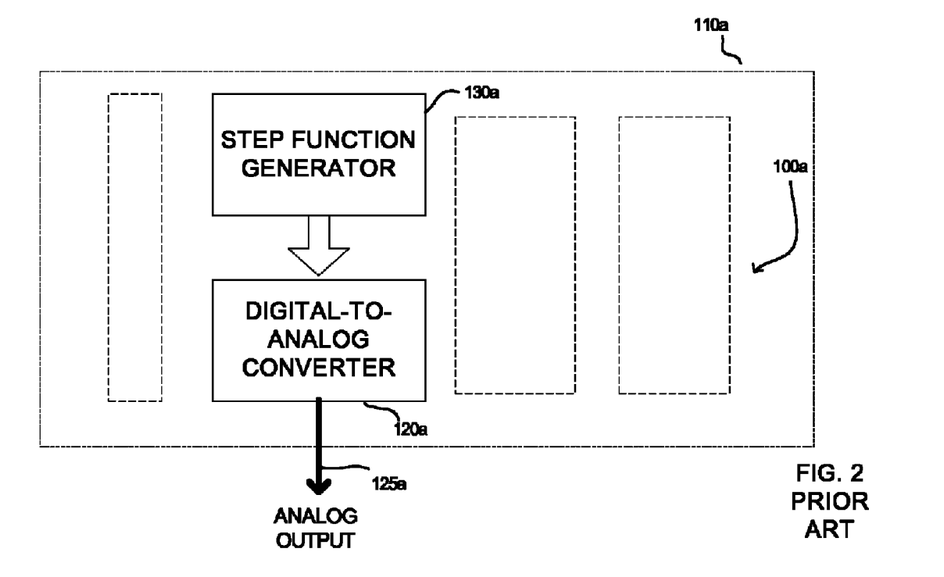
FIG. 2 illustrates another prior art circuit for testing a digital-to-analog converter in an integrated circuit on a die.

FIG. 2 shows another architecture for testing a digital-to-analog converter 120a. In this approach, the analog output is provided at an external analog port 125a of the die 110a. Consequently, the analog output voltage of the digital-to-analog converter 120a may be measured directly by suitable measurement instrumentation external to the die 110a. Again, an analog output voltage of the die 110a may be measured or otherwise detected at each step of the function generator 130a. These measurements of the analog output signals produced by the digital-to-analog converter 120a in response to each step of the step function generator 130a, can be collected by various devices external to the die 110 such as a general purpose computer or dedicated testing apparatus coupled to the external output port 125a of the die 110a. Here too, the analog data collected is typically processed by such apparatus to determine the linearity of the conversion process.

BRIEF DESCRIPTION OF THE DRAWINGS

Referring now to the drawings in which like reference numbers represent corresponding parts throughout.

DETAILED DESCRIPTION OF THE ILLUSTRATED EMBODIMENTS

In the following description, reference is made to the accompanying drawings which form a part hereof and which illustrate several embodiments of the present disclosure. It is understood that other embodiments may be utilized and structural and operational changes may be made without departing from the scope of the present description.

Figure 3:
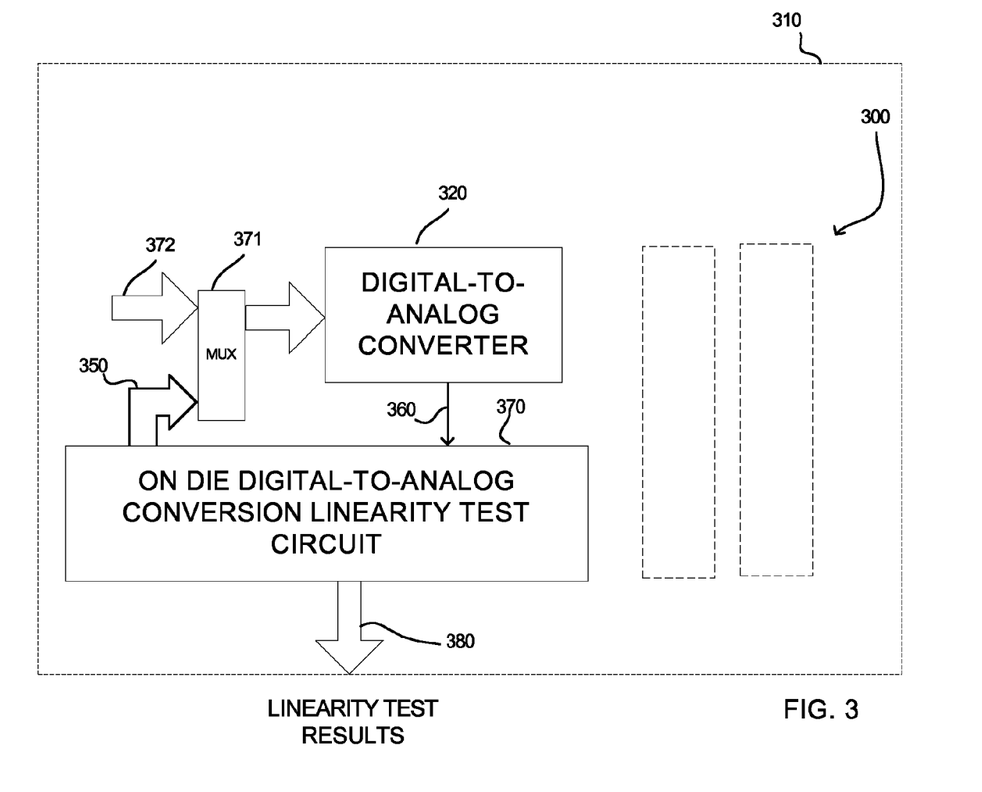
FIG. 3 illustrates one embodiment of an integrated circuit in which aspects of the description provided herein are embodied.

FIG. 3 shows one example of an integrated circuit 300 on a die 310 in accordance with one embodiment of the present description. The integrated circuit 300 may perform any of a variety of functions including one or more of a sensor, processor, controller, input/output device, etc. The integrated circuit 300 includes a digital-to-analog converter 320 which converts a digital input code at an input 350 to a corresponding analog output signal at an output 360 of the digital-to-analog converter 320.

For example, the digital-to-analog converter 320 may be for a thermal sensor, such as a catastrophic shutdown thermal sensor, for example. It is appreciated that an on-die circuit tester in accordance with the present description may be used in a variety of integrated circuits, depending upon the particular application.

In accordance with one aspect of the present description, the integrated circuit 300 further includes a test circuit 370 which is on-board the same die 310 as the digital-to-analog converter 320 of the integrated circuit 300. As explained in greater detail below, the on-die test circuit 370 can evaluate the conversion performed by the digital-to-analog converter 320 of the integrated circuit 300.

For example, in the illustrated embodiment, the test circuit 370 can characterize one or both of the linearity and monotonicity of the digital-to-analog conversion. It is appreciated that other characterizations may be performed in addition to or instead of linearity or monotonicity, depending upon the particular application.

In this embodiment, the test circuit 370 can rapidly test both the linearity and monotonicity of the conversion performed by the digital-to-analog converter 320 of the integrated circuit 300 over a wide range of digital input codes. A multiplexer 371 can select the input 350 during testing or a different input 372 during normal operation. Once testing is complete, the test results may be outputted at an output port 380 external to the die 310 in as few operations as a single scan out. As a result, testing the digital-to-analog converter 320 of the integrated circuit 300 during high volume manufacturing of devices containing the die 310 may be facilitated. For example, it is believed that both systematic and random defects that could introduce nonlinearity in a digital-to-analog building block may, in some applications, be readily detected in high volume manufacturing. It is appreciated that other aspects or advantages may be realized, depending upon the particular application.

In the illustrated embodiment, the integrated circuit 300 is initially formed on a semiconductor wafer which is then sliced into individual dies such as the die 310. A die is also often referred to as a semiconductor "chip." Thus, the test circuit 370 is "on-chip" with the remaining portion of the integrated circuit 300 of the integrated circuit chip 310. The integrated circuit 300 may be or include, for example, a central processing unit (CPU), a processor, a graphics processor, a wireless device, memory (e.g., flash/DRAM/SRAM/etc.) or other integrated circuit applications. The integrated circuit 300 may be interconnected with other integrated circuits on the die 310 or on other dies or other substrates. The die 310 may be packaged alone or with other dies in a package and interconnected with other packages and circuits on a printed circuit board, such as a motherboard, for example, or other substrates.

Figures 4, 5A, 5B:
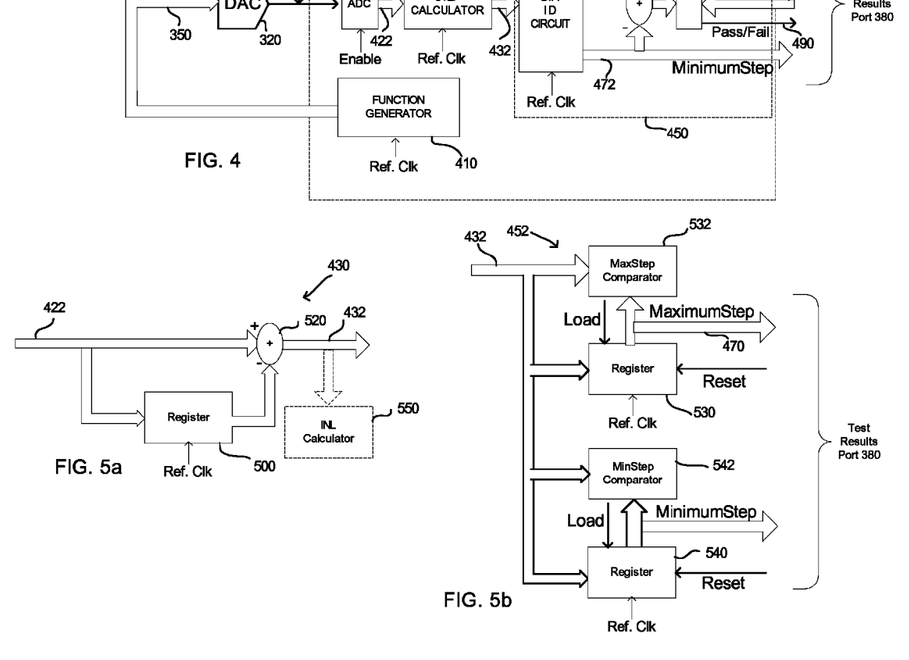
FIG. 4 is a more detailed schematic diagram of an on-die circuit for testing a digit-to analog conversion in the circuit of FIG. 3.
FIG. 5a is an embodiment of a step calculator circuit for the on-die testing circuit of FIG. 3.
FIG. 5b is an embodiment of a step differential identification circuit for the on-die testing circuit of FIG. 3.

FIG. 4 shows one example of the on-die digital-to-analog conversion test circuit 370 in greater detail, as well as the device under test, here the digital-to-analog converter 320 of the integrated circuit 300. As shown therein, the test circuit 370 includes a function generator 410 which generates a series of digital input values, such as digital input codes, for example, one step at a time, which are inputted by the input 350 of the digital-to-analog converter 320. The test circuit 370 may be used to test more than one digital-to-analog converter 320. For example, the test circuit 370 may be used to test an additional digital-to-analog converter 320*a* having an input 350*a* coupled to the function generator 310.

In the illustrated embodiment, the function generator 410 is a state machine capable of generating a sequence of digital input codes. One example of such a state machine is a counter. However, it is appreciated that other types of circuits may be used, depending upon the function to be generated.

In the illustrated embodiment, the value of each digital input code is preferably incremented (or decremented) a fixed amount each step. If the digital-to-analog conversion is linear, the value of the analog output of the digital-to-analog converter 320 will rise (or fall) a fixed amount as the digital input code is incremented (or decremented) a fixed amount each step. In the illustrated embodiment, the input code generated by the function generator 410 may have a resolution of 9 bits, for example. It is appreciated that other resolutions may be used as well, depending upon the particular application.

To test the linearity of the conversion by the digital-to-analog converter 320, the function generator 410 can sweep the input 350 from a minimum digital input code to a maximum digital input code, in increments or steps of a particular value. For example, for a 12 bit digital-to-analog converter 320, the input 350 may be swept from a minimum of 0 to a maximum of 4095 in increments of 1 each step. Alternatively, the input 350 may be swept from a maximum of 4095 to a minimum of 0 in decrements of −1 each step. It is appreciated that the actual values of the minimum, maximum and increment or decrement may vary, depending upon the particular application. Moreover, the value of the increment or decrement may vary from step to step, depending upon the particular application.

Still further, a sweep of digital input codes may switch between incrementing and decrementing, from step to step, depending upon the particular application. Thus, the function generated by the function generator 410 may itself be nonlinear, depending upon the particular application.

As used herein, the term "linearity" refers to the degree to which a function deviates from or adheres to a straight line function. Thus, the term "linearity" as used herein, includes the degree of nonlinearity of a function. Accordingly, the test circuit 370 may be used to test the linearity of converter circuits for which the conversion function is intended to be nonlinear, for example.

In each step, as the function generator 410 generates a digital input code for the digit-to-analog converter 320 under test, the test circuit 370 compares the value of the resulting conversion output for that digital input code to the value of a prior conversion output of a prior step. In the illustrated embodiment, to perform the comparison function, the test circuit 370 includes an analog-to-digital converter 420 which converts the analog output of the digital-to-analog converter 320 to a digital output value, such as a digital output code, for example, at 422 representing the value of the analog output of the digital-to-analog converter 320.

In the illustrated embodiment, the resolution of the digital output of the analog-to-digital converter 420 is greater than the resolution of the digital input 350 of the digital-to-analog converter 320. For example, for a digital-to-analog converter having an input resolution of 9 bits, the analog-to-digital converter 420 may have a digital output resolution of 12 bits. It is appreciated that other resolutions may be used, depending upon the particular application.

A step calculator circuit 430 calculates and outputs at 432 the digital difference between two consecutive digital output codes of two consecutive steps, respectively, as the input 350 to the digital-to-analog converter 320 is swept in steps across the range of digital input codes by the function generator 410. A step difference evaluation circuit 450 reviews the digital differences calculated by the step calculator circuit 430 and includes a step difference identification circuit 452 which identifies digital differences of interest for the various steps of the sweep. The results of this evaluation may be outputted to the test results port 380 on the exterior of the die 310. In the illustrated embodiment, the test results may be outputted in as few scans as a single scan out at the conclusion of the input sweep.

One test result of interest, for example, may be the value of the step having the largest digital difference value as the input 350 to the digital-to-analog converter 320 is swept in steps across the range of digital input codes by the function generator 410. Thus, the test results port 380 includes an output 470 labeled "Maximum Step" for the value of the step having the largest digital difference value.

In the illustrated embodiment, another test result identified by the step difference identification circuit 452 may be, for example, the value of the step having the smallest digital difference value as the input 350 to the digital-to-analog converter 320 is swept in steps across the range of digital input codes by the function generator 410. Thus, the test results port 380 may include an output 472 labeled "Minimum Step" for the value of the step having the smallest digital difference value.

In the illustrated embodiment, the magnitude of the largest digital difference value (Maximum Step) and the magnitude of the smallest digital difference value (Minimum Step), are each representative of the degree of linearity (or nonlinearity) of the digital-to-analog conversion process. Furthermore, if the input code is being incremented, for example, then a negative value for the minimum step size would indicate that the digital-to-analog converter output is non-monotonic while a positive value would show monotonic behavior.

In another example of a suitable test, the computed and identified digital difference values may be compared to one or more predetermined limits to provide one or more pass/fail tests on-board the die 310. For example, it is believed that the difference between the smallest digital difference value (Minimum Step) and the largest digital difference value (Maximum Step) is a measure of the differential non-linearity (DNL) of the digital to analog converter. Thus, the difference between the smallest digital difference value (Minimum Step) and the largest digital difference value (Maximum Step) may be compared to one or more predetermined limits to provide one or more pass/fail tests on-board the die 310.

In the illustrated embodiment, the difference between the largest digital difference value (Maximum Step) and the smallest digital difference value (Minimum Step) may be computed by an adder circuit 480 of the step difference evaluation circuit 450, which subtracts the smallest digital difference value (Minimum Step) from the largest digital difference value (Maximum Step). This resultant difference may be compared by a comparison circuit 482 of the step difference evaluation circuit 450, to a predetermined limit value (labeled "Limit") which may be input to the die 310 on an input 484 of the test results port 380.

In the illustrated embodiment, the Limit value represents a maximum acceptable degree of nonlinearity of the digital-to-analog conversion process. If the comparison circuit 482 determines that the difference between the largest and smallest difference values is less than the value of the step difference limit range (Limit), a bit indicating a "Pass" result may be output on a Pass/Fail output 490 of the test results port 380. Conversely, if the comparison circuit 482 determines that the difference between the largest and smallest difference values is greater than the value of the step difference limit range, a bit indicating a "Fail" result may be output on a Pass/Fail output of the test results port 380. It is appreciated that other data for the conversion process may be collected by an on-die test circuit, and processed to produce results at a test results port of the on-die test circuit, depending upon the particular application.

FIG. 5a shows an example of a more detailed embodiment of the step calculator 430 of the on-die conversion test circuit 370. The step calculator circuit 430 calculates the digital difference between two consecutive digital output codes of two consecutive steps, respectively, as the input 350 to the digital-to-analog converter 320 is swept in steps across the range of digital input codes by the function generator 410. In this embodiment, the step calculator 430 includes a register 500 which stores the digital code output 422 of the analog-to-digital converter 420. On the next step of function generator 410, the digital code input to the digital-to-analog converter 320 changes to the next value, producing a new digital output code of the analog-to-digital converter 420. The new digital output code of the analog-to-digital converter 420 is subtracted by an adder/subtractor circuit 520 from the prior digital code output of the prior step as stored by the register 500, to produce a digital difference value at output 432. In addition, the new digital code output of the analog-to-digital converter 420 is stored by the register 500 to be subtracted by the adder/subtractor circuit 520 from the next digital code output of the next step, to produce the next digital difference value. In this manner, a digital difference value is generated each step as the input 350 to the digital-to-analog converter 320 is swept in steps across the range of digital input codes by the function generator 410.

FIG. 5b shows an example of a more detailed embodiment of the step difference identification circuit 452 of the on-die conversion test circuit 370. As previously mentioned, one test result of interest may be the value of the step having the largest (e.g. the largest positive) digital difference value (Maximum Step) as the input 350 to the digital-to-analog converter 320 is swept in steps across the range of digital input codes by the function generator 410. In the illustrated embodiment, a register 530 of the step difference identification circuit 452 is initialized or reset to a zero value, representing the smallest (e.g. smallest positive) digital difference. As previously mentioned, on a step of function generator 410, in which a digital input code is presented to the digital-to-analog converter 320, the step calculator 430 generates a new digital difference value by subtracting the digital output code of the analog-to-digital converter 420, from the prior digital output code of the prior step.

The new digital difference value from the step calculator 430 is compared by a comparator 532 to the value stored by the register 530. If the new digital difference value from the step calculator 430 is greater than the value stored by the register 530, the new digital difference value from the step calculator 430 replaces the prior contents of the register 530. Conversely, if the new digital difference value from the step calculator 430 is less than the value stored by the register 530, the new digital difference value from the step calculator 430 does not replace the contents of the register 530. In this manner, the contents of the register 530 represents the largest digital difference value of the sweep so far.

The next digital difference value from the step calculator 430 of the next step similarly is compared by the comparator 532 to the value stored by the register 530. If the next digital difference value from the step calculator 430 is greater than the value of the prior step stored by the register 530, the next digital difference value from the step calculator 430 replaces the prior contents of the register 530. Conversely, if the next digital difference value from the step calculator 430 is less than the value stored by the register 530, the next digital difference value from the step calculator 430 does not replace the contents of the register 530.

The step identification circuit 452 continues operating in this manner as the input 350 to the digital-to-analog converter 320 is swept in steps across the range of digital input codes by the function generator 410. Once the sweep is completed, the contents of the register 530 will represent the largest digital difference value (Maximum Step) of the sweep. The largest digital difference value (Maximum Step) may be scanned out in a single scan through the output 470 of the test results port 380.

As previously mentioned, another test result of interest may be the difference value of the step having the smallest digital difference as the input 350 to the digital-to-analog converter 320 is swept in steps across the range of digital input codes by the function generator 410. In the illustrated embodiment, a register 540 of the step difference identification circuit 452 is initialized or reset to a +31 value, representing the highest possible digital difference. As previously mentioned, on a step of function generator 410, in which a digital input code is presented to the digital-to-analog converter 320, the step calculator 430 generates a new digital difference value by subtracting the digital output code of the analog-to-digital converter 420, from the prior digital output code of the prior step.

The new digital difference value from the step calculator 430 is compared by a comparator 542 to the value stored by the register 540. If the new digital difference value from the step calculator 430 is smaller than the value stored by the register 540, the new digital difference value from the step calculator 430 replaces the prior contents of the register 540. Conversely, if the new digital difference value from the step calculator 430 is greater than the value stored by the register 540, the new digital difference value from the step calculator 430 does not replace the contents of the register 540. In this manner, the contents of the register 540 represents the smallest (which may be the smallest positive or the most negative) digital difference value of the sweep so far.

The next digital difference value from the step calculator 430 is similarly compared by the comparator 542 to the prior value stored by the register 540. If the next digital difference value from the step calculator 430 is less than the value stored by the register 540, the next digital difference value from the step calculator 430 replaces the prior contents of the register 540. Conversely, if the next digital difference value from the step calculator 430 is greater than the value stored by the register 540, the next digital difference value from the step calculator 430 does not replace the contents of the register 540.

The step evaluator circuit 452 continues operating in this manner as the input 350 to the digital-to-analog converter 320 is swept in steps across the range of digital input codes by the function generator 410. Once the sweep is completed, the contents of the register 540 will represent the smallest (e.g. most negative or lowest positive) digital difference value (Minimum Step) of the sweep. The smallest digital difference value (Minimum Step) may be scanned out in a single scan through the output 472 of the test results port 380.

Figure 6:
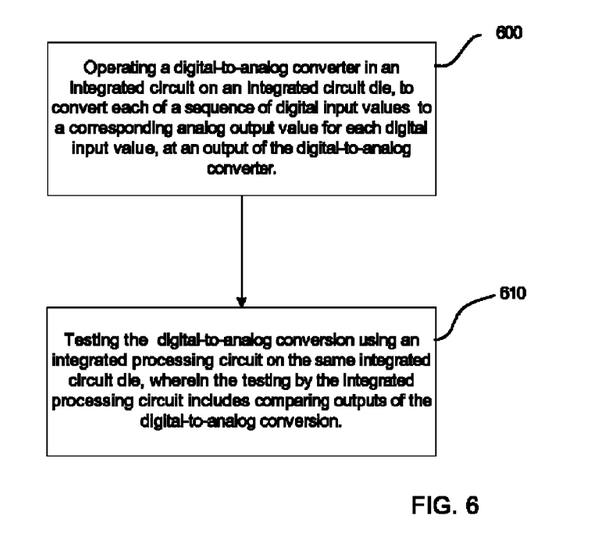
FIG. 6 is an embodiment of operations for testing a digital-to-analog converter in an integrated circuit using an on-die testing circuit.

FIG. 6 shows one example of testing operations for a digital-to-analog converter using an on-die integrated testing circuit in accordance with an embodiment of the present description. In one operation, a digital-to-analog converter in an integrated circuit on an integrated circuit die, is operated (block 600) to convert each of a sequence of digital input values to a corresponding analog output value for each digital input value, at an output of the digital-to-analog converter. For example, the digital-to-analog converter 320 (FIG. 3) of the integrated circuit 300 on the integrated circuit die 310, is operated (block 600) in a sequence of steps, to convert each of a sequence of digital input values at an input 350 to a corresponding analog output value for each digital input value, at an output 360 of the digital-to-analog converter 320, as described above.

In another operation, the digital-to-analog conversion may be tested (block 610) using an integrated testing circuit on the same integrated circuit die. In one embodiment, the testing by the integrated testing circuit includes comparing outputs of the digital-to-analog conversion. For example, the digital-to-analog conversion depicted in FIG. 3, may be tested using an integrated testing circuit 370 on the same integrated circuit die 310, wherein the testing by the integrated testing circuit 370 includes comparing outputs of the digital-to-analog conversion.

Figure 7:
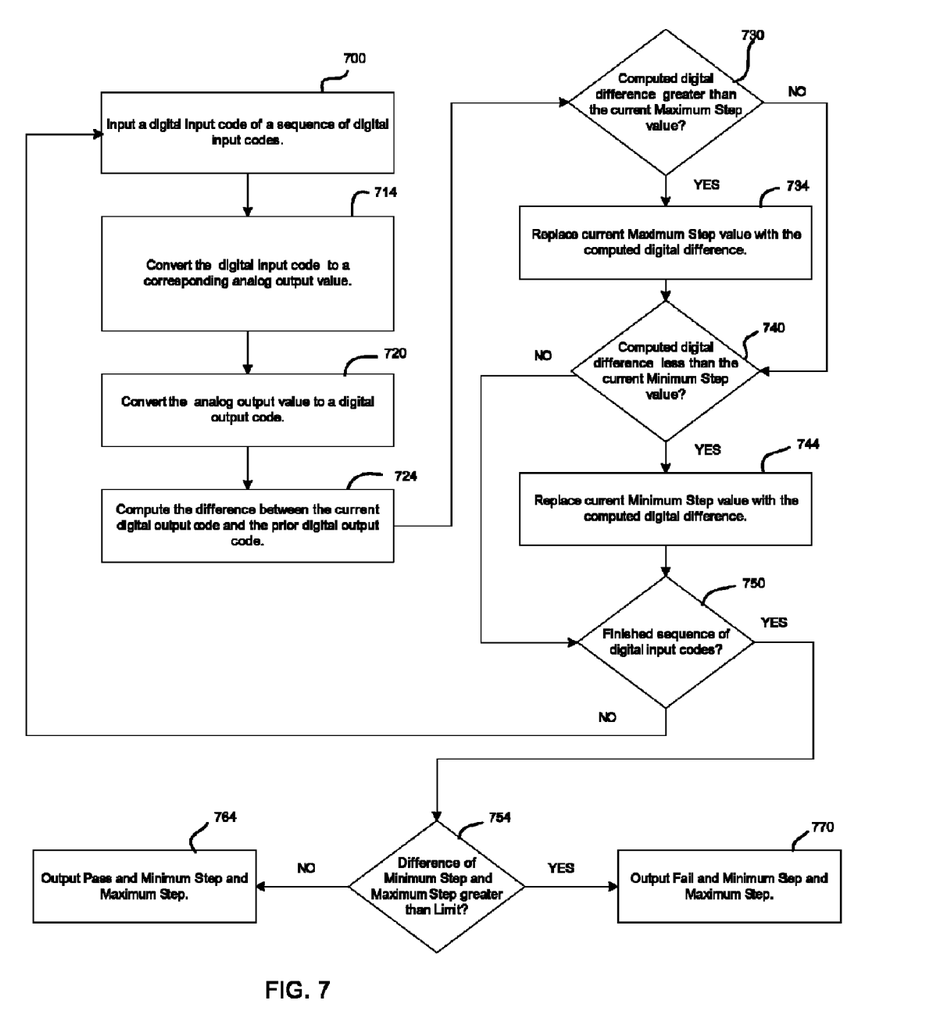
FIG. 7 is another embodiment of operations for testing a digital-to-analog converter in an integrated circuit using an on-die testing circuit.

FIG. 7 shows another example of operations of testing a digital-to-analog converter using an on-die integrated testing circuit in accordance with another embodiment of the present description. In this example, a digital input code of a sequence of digital input codes, is inputted (block 700). The inputted digital input code is converted (block 714) to a corresponding analog output value, which is converted (block 720) to a digital output code. The difference between the current digital output code and the prior digital output code is computed (block 724).

For example, the step calculator circuit 430 (FIG. 5a) calculates the digital difference between two consecutive digital output codes of two consecutive steps, as the input 350 to the digital-to-analog converter 320 is swept in steps across the range of digital input codes by the function generator 410. The register 500 stores the digital code output of the analog-to-digital converter 420. On the next step of function generator 410, the digital code input to the digital-to-analog converter 320 changes to the next value, producing a new digital output code of the analog-to-digital converter 420. The new digital output code of the analog-to-digital converter 420 is subtracted by an adder/subtractor circuit 520 from the digital code output of the prior step as stored by the register 500, to produce a digital difference value at output 432. In addition, the new digital code output of the analog-to-digital converter 420 is stored by the register 500 to be subtracted by the adder/subtractor circuit 520 from the next digital code output of the next step, to produce the next digital difference value. In this manner, a digital difference value is generated each step as the input 350 to the digital-to-analog converter 320 is swept in steps across the range of digital input codes by the function generator 410.

In addition, in the operations of FIG. 7, the largest of these digital difference values is identified and stored, and referred to herein as the "Maximum Step" value. Here, the calculated difference value is compared (block 730, FIG. 7) to the largest difference value (referred to as the current "Maximum Step" value) identified during the previous steps of the sweep. If the current computed digital difference is determined to be greater than the current stored Maximum Step value, the current Maximum Step value is replaced (block 734) with the computed digital difference. Conversely, if the current computed digital difference is determined to be less than the current Maximum Step value, the replacement operation (block 734) is skipped and the current Maximum Step value remains the same for this step.

For example, in the embodiment of FIG. 5b, the computed digital difference value from the step calculator 430 is compared by the comparator 532 to the current Maximum Step value stored by the register 530 which is initialized to zero, in this example. If the computed digital difference value from the step calculator 430 is greater than the Maximum Step value stored by the register 530, the computed digital difference value from the step calculator 430 replaces the prior contents of the register 530 and is now the current Maximum Step value. Conversely, if the computed digital difference value from the step calculator 430 is less than the value stored by the register 530, the next digital difference value from the step calculator 430 does not replace the contents of the register 530, and the current Maximum Step value remains unchanged during this step.

In addition, the smallest of these digital values is identified and stored, and referred to herein as the "Minimum Step" value. Here, the calculated difference value is compared (block 740, FIG. 7) to the smallest difference value (referred to as the current "Minimum Step" value) identified during the previous steps of the sweep. If the computed digital difference is determined to be less than the current Maximum Step value, the current Minimum Step value is replaced (block 744) with the computed digital difference. Conversely, if the computed digital difference is determined to be greater than the current Minimum Step value, the replacement operation (block 744) is skipped and the current Minimum Step value remains the same for this step.

For example, in the embodiment of FIG. 5*b*, the computed digital difference value from the step calculator 430 is compared by the comparator 542 to the current Minimum Step value stored by the register 540. If the computed digital difference value from the step calculator 430 is less than the Minimum Step value stored by the register 540, the computed digital difference value from the step calculator 430 replaces the prior contents of the register 540 and is now the current Minimum Step value. Conversely, if the computed digital difference value from the step calculator 430 is greater than the value stored by the register 530, the computed digital difference value from the step calculator 430 does not replace the contents of the register 540, and the current Minimum Step value remains unchanged during this step.

A determination is made (block 750) as to whether all digital input codes of the sequence of digital input codes have been presented to the digital-to-analog converter. If the sequence of digital input codes in the input sweep has not yet been completed, another digital input code of the sequence of digital input codes is inputted (block 700) and processed as indicated in the operations of blocks 700-744. Once the inputting and processing of the sequence of digital input codes has been completed (block 750), additional tests may be performed to evaluate the conversion process.

In this embodiment, in another operation, a Pass/Fail test is performed. For example, once the sweep of digital input codes has been completed (block 750), a determination is made (block 754) as to whether the difference between the Maximum Step and the Minimum Step exceeds a Limit which may be input to the die. If the difference between the Maximum Step and the Minimum Step is determined to be less than the Limit, a bit indicating a Pass condition may be outputted (block 764) from the die. Conversely, if difference between the Maximum Step and the Minimum Step is determined to be greater than the Limit, a bit indicating a Fail condition may be outputted (block 770) from the die.

For example, in the embodiment of FIG. 4, the difference between the largest digital difference value (Maximum Step) and the smallest digital difference value (Minimum Step) may be calculated by an adder circuit 480 of the step difference evaluation circuit 450, which subtracts the smallest digital difference value (Minimum Step) from the largest digital difference value (Maximum Step). The resultant difference may be compared by a comparison circuit 482 of the step difference evaluation circuit 450, to a predetermined limit value (labeled "Limit") which may be input to the die 310 on an input 484 of the test results port 380.

If the comparison circuit 482 determines that the difference between the largest and smallest difference values is less than the value of the step difference limit range (Limit), a bit indicating a "Pass" result may be output on a Pass/Fail output 490 of the test results port 380. Conversely, if the comparison circuit 482 determines that the difference between the largest and smallest difference values is greater than the value of the step difference limit range, a bit indicating a "Fail" result may be output on a Pass/Fail output of the test results port 380. It is appreciated that other data for the conversion process may be collected by an on-die test circuit, and processed to produce results at a test results port of the on-die test circuit, depending upon the particular application.

The results of the evaluation of the conversion may be outputted in as few as one scan out operation, depending upon the particular application. For example, a Pass result and the identified Minimum Step and Maximum Step may be output in as few as a single scan out operation (block 764) or a Fail result and the identified Minimum Step and Maximum Step operation (block 770) may be output in as few as a single scan out operation (block 770). It is appreciated that a greater number of scan outs may be used to obtain the conversion evaluation results, depending upon the particular application.

As indicated above, the magnitude of the largest digital difference value (Maximum Step) and the magnitude of the smallest digital difference value (Minimum Step), are each representative of the degree of linearity (or nonlinearity) of the digital-to-analog conversion process. In another aspect of the present description, it is appreciated that other parameters of conversion accuracy may be obtained in the course of the on-die testing. For example, it is believed that integral non-linearity (INL) and differential nonlinearity (DNL) are additional examples of conversion accuracy parameters that may be obtained by an on-die testing circuit in accordance with the present description.

As previously mentioned, it is believed that the difference between the smallest digital difference value (Minimum Step) and the largest digital difference value (Maximum Step) (as output, for example, by the adder circuit 480 of the step difference evaluation circuit 450) is representative of the differential non-linearity (DNL) of the digital to analog converter. An ideal analog-to-digital converter has a differential nonlinearity (DNL)=0 LSB (least significant bit) where each analog step equals 1 LSB (1LSB=R/($2^N$–1), where R is the full-scale range and N is the resolution of the analog-to-digital converter in bits). Thus, in an ideal analog-to-digital converter, the analog outputs are spaced exactly 1 LSB apart. It is believed that a DNL of zero indicates ideal behavior, which includes monotonic. In addition, it is believed that a minimum step size of at least zero also shows monotonic behavior. Still further, it is believed that a minimum step size greater than zero indicates that the transfer function is strictly monotonic, assuming that the input is a positive ramp.

In another embodiment, the digital difference values may be used to calculate values representative of the INL as well as the DNL values. For example, it is believed that a value representative of INL can be calculated by comparing consecutive digital difference values in a sweep of input values to determine a maximum deviation from a straight line conversion. In one embodiment, an INL calculator 550 (FIG. 5*a*) could include a circuit that has access to a microprocessor on the die or alternatively appropriate processing may be embedded in the on-die testing circuit to determine the INL values. It is appreciated that to extract INL, two consecutive sweeps may be involved. For example, in a first sweep of digital input values, the average step may be extracted and in the second sweep, the actual DNL may be computed and successive values at each step may be accumulated, which may return the INL value at the end of second sweep.

Figure 8:
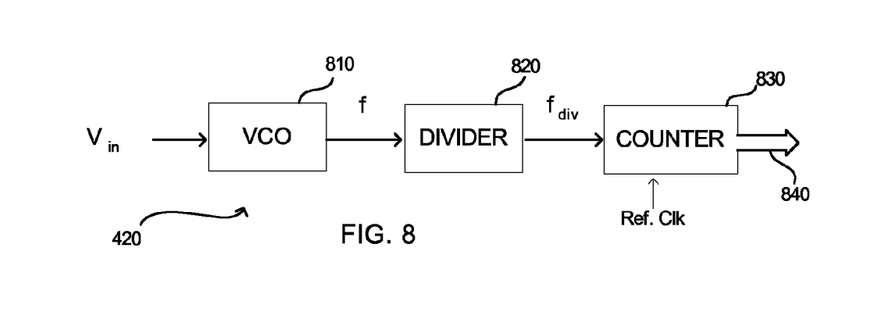
FIG. 8 is an embodiment of an analog-to-digital converter circuit for the on-die testing circuit of FIG. 3.

In another aspect of the present description, referring now to FIG. 8, the analog-to-digital converter 420 includes a ring oscillator which is believed to be relatively compact yet sufficiently accurate for conversion evaluation. In the illustrated embodiment, the ring oscillator includes a voltage-controlled oscillator (VCO) 810 which produces an oscillating signal fat a frequency proportional to the input voltage Vin. The output of the VCO 810 is divided by a divider circuit 820 to produce an oscillating signal fdiv at a frequency which is reduced from that of the signal f. It is appreciated that in some embodiments, a divider circuit may be omitted. A counter 830 counts the (divided or undivided) pulses of the oscillator such that the digital output 840 of the counter 830 is proportional to the input voltage Vin. In this manner, an analog voltage Vin is converted to a digital count at 840 over a predetermined interval or period t in which the period t is the proportionality factor.

In the illustrated embodiment, the counter 830 is synchronized with the sweep of digital input codes presented to the digital-to-analog converter 320. Thus, the counter 830 may be synchronized with the function generator 410 (FIG. 4) using a common clock signal such as the clock signal Reference Clock, as indicated. Similarly, the analog-to-digital converter 420 (FIG. 4) and the registers 500 (FIGS. 5a), 530 and 540 (FIG. 5b) may be synchronized with the function generator 410 using a common clock signal such as the clock signal Reference Clock, as indicated.

Additional Embodiment Details

The described techniques for evaluating digital-to-analog conversion with an on-die testing circuit may be embodied as a method, apparatus or article of manufacture using standard programming and/or engineering techniques to produce software, firmware, hardware, or any combination thereof. The outputs of the on-die circuitry which may include programmable processors, dedicated processors, comparators or adder/subtractor circuits, may be processed by on-die logic circuitry, firmware or software or processed by off chip logic circuitry, firmware or software, or a combination thereof, to evaluate the conversion. The term "article of manufacture" as used herein refers to code or logic embodied in hardware logic (e.g., an integrated circuit chip, Programmable Gate Array (PGA), Application Specific Integrated Circuit (ASIC), etc.) or a computer readable medium, such as magnetic storage medium (e.g., hard disk drives, floppy disks, tape, etc.), optical storage (CD-ROMs, optical disks, etc.), volatile and non-volatile memory devices (e.g., EEPROMs, ROMs, PROMs, RAMs, DRAMs, SRAMs, firmware, programmable logic, etc.).

Code in the computer readable medium is accessed and executed by a processor. The "article of manufacture" may comprise the medium in which the code is embodied. Additionally, the "article of manufacture" may comprise a combination of hardware and software components in which the code is embodied, processed, and executed. Of course, those skilled in the art will recognize that many modifications may be made to this configuration without departing from the scope of the present description, and that the article of manufacture may comprise any tangible information bearing medium known in the art.

In certain applications, the conversion evaluation embodiments may be embodied in a computer system including a video controller to render information to display on a monitor or other display coupled to the computer system, a device driver and a network controller, such as a computer system comprising a desktop, workstation, server, mainframe, laptop, handheld computer, etc. Alternatively, the conversion evaluation circuit embodiments may be embodied in a computing device that does not include, for example, a video controller, such as a switch, router, etc, or does not include a network controller, for example.

The illustrated logic of FIGS. 6, 7 shows certain events occurring in a certain order. In alternative embodiments, certain operations may be performed in a different order, modified or removed. Moreover, operations may be added to the above described logic and still conform to the described embodiments. Further, operations described herein may occur sequentially or certain operations may be processed in parallel. Yet further, operations may be performed by a single processing unit or by distributed processing units.

Figure 9:
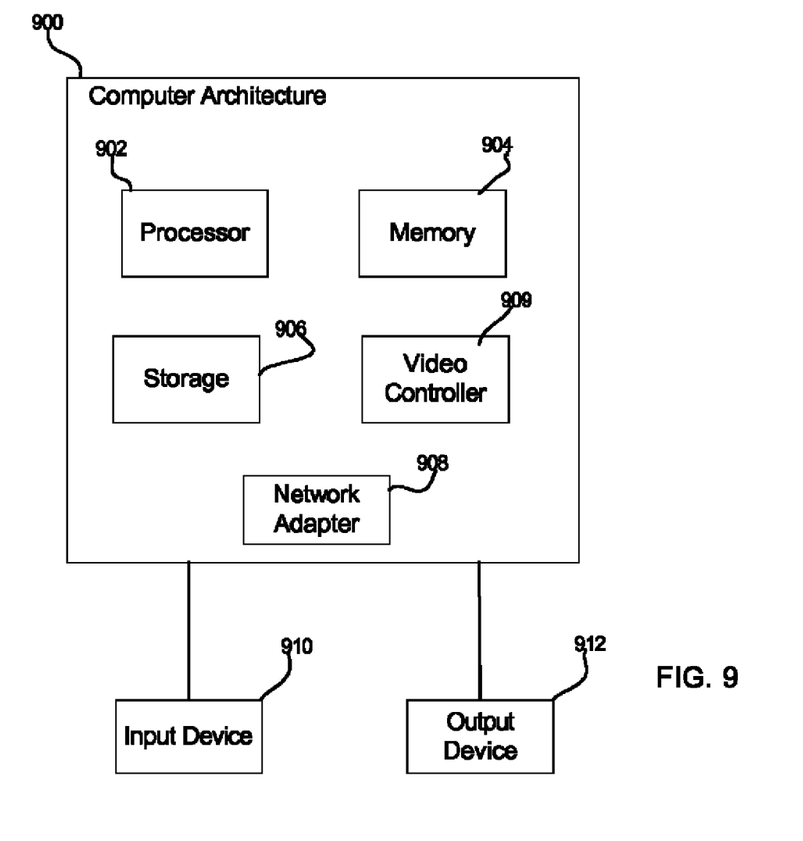
FIG. 9 is an embodiment of a system employing an integrated circuit in which aspects of the description provided herein are embodied.

FIG. 9 illustrates one embodiment of a computer architecture 900 of components, any one of which may include an integrated circuit in accordance with the present description. The computer architecture 900 may comprise any computing device known in the art, such as a mainframe, server, personal computer, workstation, laptop, handheld computer, telephony device, network appliance, virtualization device, storage controller, etc. The architecture 900 may include a processor 902 (e.g., a microprocessor), a memory 904 (e.g., a volatile memory device), and storage 906 (e.g., a non-volatile storage, such as magnetic disk drives, optical disk drives, a tape drive, etc.). The storage 906 may comprise an internal storage device or an attached or network accessible storage. Programs in the storage 906 are loaded into the memory 904 and executed by the processor 902 in a manner known in the art. The architecture further includes a network controller or adapter 908 to enable communication with a network, such as an Ethernet, a Fibre Channel Arbitrated Loop, etc. Further, the architecture may, in certain embodiments, include a video controller 909 to render information on a display monitor, where the video controller 909 may be embodied on a video card or integrated on integrated circuit components mounted on the motherboard. An input device 910 is used to provide user input to the processor 902, and may include a keyboard, mouse, pen-stylus, microphone, touch sensitive display screen, or any other activation or input mechanism known in the art. An output device 912 is capable of rendering information transmitted from the processor 902, or other component, such as a display monitor, printer, storage, etc.

The network adapter 908 may embodied on a network card, such as a Peripheral Component Interconnect (PCI) card, PCI-express, or some other I/O card, or on integrated circuit components mounted on the motherboard. The storage 906 may comprise an internal storage device or an attached or network accessible storage. Programs in the storage 906 are loaded into the memory 904 and executed by the processor 902. Any one or more of the devices of the computer architecture 900 may include one or more integrated circuits having an on-die conversion testing circuit as described herein.

Figure 10:
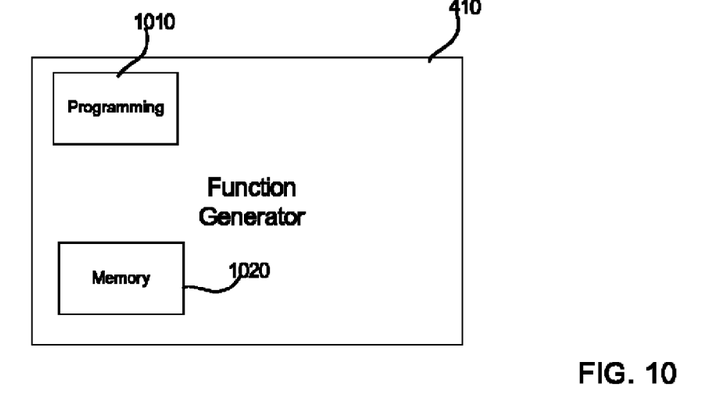
FIG. 10 is an alternative embodiment of a function generator for the calculator circuit for the on-die testing circuit of FIG. 3.

FIG. 10 shows yet another alternative embodiment in which the function generator 410 includes programming logic 1010 which allows a variable starting or ending digital input code of the sweep of codes to be selected by a test technician or engineer. The programming logic 1010 may further permit the size of the step in the sweep of codes to be variable and selectable as well. Also, the programming logic can provide for automatic initiation of the conversion testing and calibration operations.

Still further, the function generator 410 includes a memory 1020, which is responsive to the step difference identification circuit 452, to record the actual digital input codes at which the largest step difference (Maximum Step) and the smallest step difference (Minimum Step) occur. It is appreciated that such capabilities may facilitate identifying systematic defects.

The foregoing description of various embodiments has been presented for the purposes of illustration and description. It is not intended to be exhaustive or to limit to the precise form disclosed. Many modifications and variations are possible in light of the above teaching.

What is claimed is:

1. A method, comprising:
operating a digital-to-analog converter in an integrated circuit of an integrated circuit die, to convert each of a plurality of digital input values of a step function, to a corresponding analog output value for each digital input value of the step function, at an output of the digital-to-analog converter; and
testing the linearity of the digital-to-analog conversion using an integrated testing circuit having an input coupled to the output of the digital-to-analog converter and being on-die with the same integrated circuit die as the digital-to-analog converter, wherein the testing by the integrated testing circuit includes comparing a first conversion output value corresponding to a first digital input value of the step function to a second conversion output value corresponding to a second digital input value of the step function, and wherein the conversion value comparing by the integrated testing circuit includes converting each analog output value of the output of the digital-to-analog converter to a digital output value using an analog-to-digital converter of the integrated testing circuit, and computing the difference between two digital output values using an integrated adder/subtractor circuit of the integrated testing circuit to provide a digital output difference value, wherein the first conversion output value is converted to a first digital output value and the second conversion output value is converted to a second digital output value, and the difference between the first and second digital output values is computed to provide a first digital output difference value.

2. The method of claim 1, wherein the computing the difference provides a plurality of digital output difference values, each digital output difference value being the difference between two digital output values, and wherein the conversion value comparing by the integrated testing circuit further includes comparing the digital output difference values of the plurality of digital output difference values to determine a maximum digital output difference value of the plurality of digital output difference values.

3. The method of claim 1, wherein the computing the difference provides a plurality of digital output difference values, each digital output difference value being the difference between two digital output values, and wherein the conversion value comparing by the integrated testing circuit includes comparing the digital output difference values of the plurality of digital output difference values to determine a minimum digital output difference value of the plurality of digital output difference values.

4. The method of claim 2, wherein the conversion value comparing by the integrated testing circuit further includes comparing the digital output difference values of the plurality of digital output difference values to determine a minimum digital output difference value of the plurality of digital output difference values, and
wherein the testing by the integrated testing circuit further includes computing the difference between the maximum digital output difference value and the minimum digital output difference value of the plurality of digital output difference values, using an integrated adder/subtractor circuit of the integrated testing circuit, to provide a maximum/minimum digital output difference value.

5. The method of claim 4, wherein the testing by the integrated testing circuit further includes comparing the maximum/minimum digital output difference value to a predetermined digital output difference range limit value to determine a pass/fail condition of the digital-to-analog converter.

6. The method of claim 1 wherein the computing the difference between two digital output values computes the difference between two adjacent digital output values to provide a digital output difference value which is a digital output step difference value for a step of the step function.

7. The method of claim 1 wherein the converting each analog output value of the output of the digital-to-analog converter to a digital output value using an analog-to-digital converter includes generating a oscillating signal using a voltage-controlled oscillator of the analog-to-digital converter, which voltage-controlled oscillator has an input coupled to the output of the digital-to-analog converter, and counting the pulses of the oscillating signal using a counter of the digital-to-analog converter, which counter has an input coupled to the output of the oscillator circuit.

8. A device, comprising:
an integrated circuit die having an integrated circuit which includes a digital-to-analog converter having an input and an output, said digital-to-analog converter being adapted to convert each of a plurality of digital input values of a step function, to a corresponding analog output value for each digital input value of the step function, at an output of the digital-to-analog converter;
wherein said integrated circuit further includes an integrated testing circuit on-die with the same integrated circuit die as the digital to analog converter, wherein the integrated testing circuit is adapted to test the linearity of the digital-to-analog conversion wherein the testing by the integrated testing circuit includes comparing a first conversion output value corresponding to a first digital input value of the step function to a second conversion output value corresponding to a second digital input value of the step function, and wherein the integrated testing circuit includes an analog-to-digital converter having an input coupled to the output of the digital-to-analog converter, and an integrated adder/subtractor circuit coupled to an output of the analog-to-digital converter, wherein said conversion value comparing by the integrated testing circuit includes converting each analog output value of the output of the digital-to-analog converter to a digital output value using the analog-to-digital converter of the integrated testing circuit, and computing the difference between two digital output values using the integrated adder/subtractor circuit of the integrated testing circuit to provide a digital output difference value, wherein the first conversion output value is converted to a first digital output value and the second conversion output value is converted to a second digital output value, and the difference between the first and second digital output values is computed to provide a first digital output difference value.

9. The device of claim 8, wherein the computing the difference provides a plurality of digital output difference values, each digital output difference value being the difference between two digital output values, and wherein the integrated testing circuit includes a first comparator having an input coupled to the output of the adder/subtractor circuit, and adapted to compare the digital output difference values of the plurality of digital output difference values to determine a maximum digital output difference value of the plurality of digital output difference values.

10. The device of claim 8, wherein the computing the difference provides a plurality of digital output difference values, each digital output difference value being the difference between two digital output values, and wherein the integrated testing circuit includes a comparator having an input coupled to the output of the adder/subtractor circuit, and adapted to compare the digital output difference values of the plurality of digital output difference values to determine a minimum digital output difference value of the plurality of digital output difference values.

11. The device of claim 9, wherein the integrated testing circuit includes a second comparator having an input coupled to the output of the adder/subtractor circuit, and adapted to compare the digital output difference values of the plurality of digital output difference values to determine a minimum digital output difference value of the plurality of digital output difference values, and, wherein the integrated testing circuit further includes a second integrated adder/subtractor circuit and wherein the integrated testing circuit is further adapted to compute the difference between the maximum digital output difference value and the minimum digital output difference value of the plurality of digital output difference values, using the integrated adder/subtractor circuit of the integrated testing circuit, to provide a maximum/minimum digital output difference value.

12. The device of claim 11, wherein the integrated testing circuit further includes a third comparator and wherein the integrated testing circuit is further adapted to compare the maximum/minimum digital output difference value to a predetermined digital output difference range limit value to determine a pass/fail condition of the digital-to-analog converter.

13. The device of claim 8 wherein the computing the difference between two digital output values computes the difference between two adjacent digital output values to provide a digital output difference value which is a digital output step difference value for a step of the step function.

14. The device of claim 8 wherein the analog-to-digital converter circuit further includes a counter and a voltage-controlled oscillator having an input coupled to the output of the digital-to-analog converter and an output coupled to the counter, said voltage-controlled oscillator being adapted generate an oscillating signal, said counter being adapted to count the pulses of the oscillating signal.

15. A system, comprising:
a circuit board;
an integrated circuit die carried by the circuit board, the integrated circuit die having an integrated circuit which includes a digital-to-analog converter having an input and an output, said digital-to-analog converter being adapted to convert each of a plurality of digital input values of a step function, to a corresponding analog output value for each digital input value of the step function, at an output of the digital-to-analog converter;
wherein said integrated circuit further includes an integrated testing circuit on-die with the same integrated circuit die as the digital to analog converter, wherein the integrated testing circuit is adapted to test the linearity of the digital-to-analog conversion wherein the testing by the integrated testing circuit includes comparing a first conversion output value corresponding to a first digital input value of the step function to a second conversion output value corresponding to a second digital input value of the step function;
at least one system memory which includes an operating system;
a processor coupled to the memory;
a display; and
a video display controller coupled to the display;
wherein the integrated testing circuit includes an analog-to-digital converter having an input coupled to the output of the digital-to-analog converter, and an integrated adder/subtractor circuit coupled to an output of the analog-to-digital converter, wherein said conversion value comparing by the integrated testing circuit includes converting each analog output value of the output of the digital-to-analog converter to a digital output value using the analog-to-digital converter of the integrated testing circuit, and computing the difference between two digital output values using the integrated adder/subtractor circuit of the integrated testing circuit to provide a digital output difference value, wherein the first conversion output value is converted to a first digital output value and the second conversion output value is converted to a second digital output value, and the difference between the first and second digital output values is computed to provide a first digital output difference value.

16. The system of claim 15, wherein the computing the difference provides a plurality of digital output difference values, each digital output difference value being the difference between two digital output values, and wherein the integrated testing circuit includes a first comparator having an input coupled to the output of the adder/subtractor circuit, and adapted to compare the digital output difference values of the plurality of digital output difference values to determine a maximum digital output difference value of the plurality of digital output difference values.

17. The system of claim 16, wherein the integrated testing circuit includes a second comparator having an input coupled to the output of the adder/subtractor circuit, and adapted to compare the digital output difference values of the plurality of digital output difference values to determine a minimum digital output difference value of the plurality of digital output difference values;
wherein the analog-to-digital converter circuit further includes a counter and a voltage-controlled oscillator having an input coupled to the output of the digital-to-analog converter and an output coupled to the counter, said counter being adapted to count the pulses of the oscillating signal;
wherein the integrated testing circuit further includes a second integrated adder/subtractor circuit and wherein the integrated testing circuit is further adapted to compute the difference between the maximum digital output difference value and the minimum digital output difference value of the plurality of digital output difference values, using the second integrated adder/subtractor circuit of the integrated testing circuit, to provide a maximum/minimum digital output difference value;
wherein the integrated testing circuit further includes a third comparator and wherein the integrated testing circuit is further adapted to compare the maximum/minimum digital output difference value to a predetermined digital output difference range limit value to determine a pass/fail condition of the digital-to-analog converter; and
wherein the computing the difference between two digital output values computes the difference between two adjacent digital output values to provide a digital output difference value which is a digital output step difference value for a step of the step function.

* * * * *